(12) United States Patent
He et al.

(10) Patent No.: US 10,811,561 B2
(45) Date of Patent: Oct. 20, 2020

(54) ULTRAVIOLET LED CHIP AND MANUFACTURING METHOD THEREOF

(71) Applicant: GUANGDONG UNIVERSITY OF TECHNOLOGY, Guangzhou (CN)

(72) Inventors: Miao He, Guangzhou (SG); Sipan Yang, Guangzhou (CN); Chengmin Wang, Guangzhou (CN); Run Wang, Guangzhou (CN); Hailiang Zhou, Guangzhou (CN)

(*) Notice: Subject to any disclaimer, the term of this patent is extended or adjusted under 35 U.S.C. 154(b) by 0 days.

(21) Appl. No.: 16/153,710

(22) Filed: Oct. 6, 2018

(65) Prior Publication Data
US 2019/0051793 A1 Feb. 14, 2019

Related U.S. Application Data

(63) Continuation of application No. PCT/CN2017/112028, filed on Nov. 21, 2017.

(30) Foreign Application Priority Data

Jul. 31, 2017 (CN) .......................... 2017 1 0640094

(51) Int. Cl.
*H01L 33/06* (2010.01)
*H01L 33/32* (2010.01)
(Continued)

(52) U.S. Cl.
CPC .......... *H01L 33/06* (2013.01); *H01L 27/0255* (2013.01); *H01L 27/15* (2013.01);
(Continued)

(58) Field of Classification Search
CPC ..... H01L 33/06; H01L 33/0075; H01L 33/04; H01L 33/32; H01L 33/325; H01L 33/36;
(Continued)

(56) References Cited

U.S. PATENT DOCUMENTS

| 6,185,240 B1 | 2/2001 | Jiang et al. |
| 2010/0096652 A1* | 4/2010 | Choi .................. H01L 33/08 257/98 |

(Continued)

FOREIGN PATENT DOCUMENTS

| CN | 101916769 A | 12/2010 |
| CN | 106981563 A | 7/2017 |

(Continued)

OTHER PUBLICATIONS

Machine English Translation of Chinese Patent CN 106981563 (Year: 2017).*

(Continued)

*Primary Examiner* — Dzung Tran
(74) *Attorney, Agent, or Firm* — Erson IP (Nelson IP)

(57) ABSTRACT

In an ultraviolet LED chip, an epitaxial structure can be isolated into two insulated structures, i.e. a first and a second epitaxial structures by growing the epitaxial structure on a surface of a substrate, and arranging an insulating layer and a groove contacting layer in the middle of the epitaxial structure. The N-type AlGaN layer is stretched out through the groove contacting layer. In the ultraviolet LED chip, through the cooperation among the N electrode, P electrode and intermediate electrode on the base plate along with the first and second epitaxial structures, an LED and an ESD are formed respectively. The ESD is connect to the ends of LED in anti-parallel for providing an electrostatic discharging channel, so as to reduce the direct damage of the ultraviolet LED chip caused by electrostatic discharging, and increase a forward voltage of the LED and the antistatic intensity.

7 Claims, 5 Drawing Sheets

(51) Int. Cl.
*H01L 33/62* (2010.01)
*H01L 33/36* (2010.01)
*H01L 33/64* (2010.01)
*H01L 27/02* (2006.01)
*H01L 33/00* (2010.01)
*H01L 33/46* (2010.01)
*H01L 33/40* (2010.01)
*H01L 27/15* (2006.01)
*H01L 33/38* (2010.01)
*H01L 33/04* (2010.01)

(52) U.S. Cl.
CPC .......... *H01L 33/0075* (2013.01); *H01L 33/04* (2013.01); *H01L 33/32* (2013.01); *H01L 33/325* (2013.01); *H01L 33/36* (2013.01); *H01L 33/382* (2013.01); *H01L 33/405* (2013.01); *H01L 33/46* (2013.01); *H01L 33/62* (2013.01); *H01L 33/641* (2013.01)

(58) Field of Classification Search
CPC ..... H01L 33/382; H01L 33/405; H01L 33/46; H01L 33/62; H01L 33/641; H01L 27/0255; H01L 27/15
USPC .......................................... 257/79
See application file for complete search history.

(56) References Cited

U.S. PATENT DOCUMENTS

| | | | |
|---|---|---|---|
| 2011/0108865 A1* | 5/2011 | Aldaz | H01L 33/62 257/98 |
| 2011/0272728 A1* | 11/2011 | Rode | H01L 25/167 257/99 |
| 2012/0025249 A1* | 2/2012 | Jeong | H01L 27/15 257/98 |
| 2014/0361279 A1* | 12/2014 | Schicktanz | H01L 51/50 257/40 |
| 2015/0171262 A1* | 6/2015 | Kim | H01L 33/32 257/13 |
| 2016/0284941 A1* | 9/2016 | Seo | H01L 33/46 |
| 2017/0179335 A1* | 6/2017 | Billingsley | H01L 21/02507 |

FOREIGN PATENT DOCUMENTS

| | | |
|---|---|---|
| KR | 20010088929 A | 9/2001 |
| TW | 200527702 A | 8/2005 |

OTHER PUBLICATIONS

Internation Search Report of PCT/CN2017/112028, dated Apr. 13, 2018.

* cited by examiner

ULTRAVIOLET LED CHIP AND MANUFACTURING METHOD THEREOF

CROSS-REFERENCE TO RELATED APPLICATIONS

This application is a continuation of International Patent Application No. PCT/CN2017/112028 with a filing date of Nov. 21, 2017, designating the United States, now pending, and further claims priority to Chinese Patent Application No. 201710640094.2 with a filing date of Jul. 31, 2017. The content of the aforementioned application, including any intervening amendments thereto, is incorporated herein by reference.

TECHNICAL FIELD

The disclosure relates to a technical field of an LED chip, and particularly to an ultraviolet LED chip and manufacturing method thereof.

BACKGROUND OF THE PRESENT INVENTION

Nowadays, the ultraviolet light sources have been applied widely in fields of biomedical, sterilization, printing lithography, photocuring production, communication detection etc. The traditional ultraviolet light sources have been further replaced by nitride ultraviolet LEDs for their excellent output performance and a series of advantages such as long life, cold light source, high efficiency and reliability, uniform illumination brightness, environmental protection, safety and non-toxicity.

Figure 1:
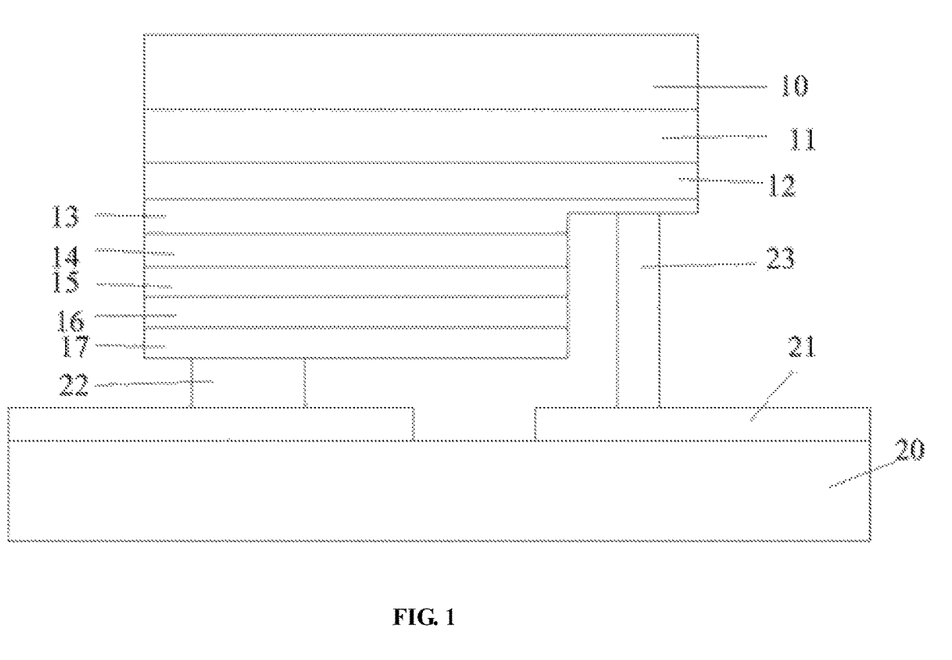
FIG. 1 is a sectional structural view of an ultraviolet LED chip in the prior art.

Referring to FIG. 1, a sectional structure of an ultraviolet LED chip in current mainstream includes a substrate 10 and abase plate 20. An epitaxial structure including an AlN nucleation layer 11, a superlattice layer 12, an N-type AlGaN layer 13, a quantum well layer 14, an electron blocking layer 15, a first P-type conducting layer 16, and a second P-type conducting layer 17 is arranged on a surface of the substrate. A wiring layer 21, an N electrode 22, and a P electrode 23 are arranged on a surface of the base plate 20. The base plate and the substrate are assembled by a flip-chip eutectic soldering process to achieve electrical connection between the electrode and the epitaxial structure. For the ultraviolet LED chip, the first P-type conducting layer 16 is typically a P-type AlGaN layer or a P-type AlGaN transition layer, and the second P-type conducting layer is typically a P-type GaN layer.

During the later process of Ohmic contacting layer preparation, electrode evaporation, flip-chip eutectic soldering and passivation, there are some defects exist in the ultraviolet LED chip described above, that power type ultraviolet LED chip generates lots of heat but fails to fling them off timely, causing limitation on the chip performance, poor heat dissipation of the insulating layer arranged on the metal base plate, and hazard of electrostatic discharging in the human body mode or the machine mode.

Therefore, how to solve the problem of poor heat dissipation and electrostatic discharging hazard in the ultraviolet LED chip has become a question that the R&D personnel in this field try to answer.

SUMMARY OF PRESENT INVENTION

Aiming at the problems of poor heat dissipation and electrostatic discharging hazard, the present disclosure provides an ultraviolet LED chip and manufacturing method thereof.

For solving the technical problems above, the embodiments provide the following technical solutions:

An ultraviolet LED chip comprises a substrate, an epitaxial structure growing on a surface of the substrate, an insulating layer arranged in the epitaxial structure, a groove contacting layer arranged in the epitaxial structure, and a base plate located on a side of the epitaxial structure away from the substrate; a wiring layer, a P electrode, an N electrode, and an intermediate electrode are arranged on a surface of the base plate facing the substrate; the epitaxial structure comprises: an AlN nucleation layer, a superlattice layer, an N-type AlGaN layer, a quantum well layer, an electron blocking layer, a first P-type conducting layer, a second P-type conducting layer, a metal reflecting layer and a film conducting layer growing on the surface of the substrate in sequence; the insulating layer is located in a middle of the epitaxial structure for isolating the epitaxial structure, and separating the epitaxial structure into a first epitaxial structure and a second epitaxial structure; the groove contacting layer penetrates a portion of the first epitaxial structure, is connected electrically to the N-type AlGaN layer in the first epitaxial structure, and is insulated from other structures in the first epitaxial structure; a slope is defined on a side of the groove contacting layer away from the insulating layer; and the P electrode is connected electrically to the film conducting layer in the first epitaxial structure, and the N electrode is connected electrically to the N-type AlGaN layer in the second epitaxial structure, the intermediate electrode is connected electrically to the groove contacting layer and the film conducting layer in the second epitaxial structure.

Optionally, the N-type AlGaN layer comprises the first N-type AlGaN layer and the second N-type AlGaN layer.

The second N-type AlGaN layer is located at a side of the first N-type AlGaN layer away from the superlattice layer; a doping concentration of epitaxial material in the second N-type AlGaN layer is lower than that in the first N-type AlGaN layer; and an epitaxial layer thickness of the second N-type AlGaN layer is smaller than that of the first N-type AlGaN layer.

Optionally, the epitaxial structure further comprises: an N-type electron energy regulating layer located between the first and the second N-type AlGaN layers; a dielectric constant of the N-type electron energy regulating layer is smaller than those of the first and the second N-type AlGaN layers, and a doping concentration of the epitaxial material in the N-type electron energy regulating layer is greater than those in the first and the second N-type AlGaN layers.

Optionally, the ultraviolet LED chip further comprises: a passivation layer covering side walls and bare terraces of the first and the second epitaxial structures; the passivation layer includes a first connection portion, and the first connection portion is located between the intermediate electrode and the first epitaxial structure and on a side of the groove contacting layer away from the insulating layer, so as to make the groove contacting layer connected electrically to the first N-type AlGaN layer in the first epitaxial structure and make the groove contacting layer insulated from other structures in the first epitaxial structure.

Optionally, a thickness of the second N-type AlGaN layer is 0.1 μm±0.01 μm with endpoints included.

Optionally, the epitaxial structure further comprises: a current expansion layer located between the second N-type AlGaN layer and the quantum well layer.

Optionally, the ultraviolet LED chip further comprises a first electrode contacting layer and a second electrode contacting-layer; the passivation layer includes a second connection portion; the first electrode contacting layer penetrates the film conducting layer in the first epitaxial structure, and the P electrode is connected electrically to the metal reflecting layer in the first epitaxial structure through the first electrode contacting layer; the second electrode contacting layer penetrates the second epitaxial structure, and the N electrode is connected electrically to the first N-type AlGaN layer in the second epitaxial structure through the second electrode contacting layer; and the second connection portion annularly covers a side wall of the second electrode contacting layer to insulate the second electrode contacting layer from other structures in the second epitaxial structure.

A manufacturing method of the ultraviolet LED chip comprises:

Providing a substrate;

Preparing an AlN nucleation layer, a superlattice layer, an N-type AlGaN layer, an quantum well layer, an electron blocking layer, a first P-type conducting layer, a second P-type conducting layer, a metal reflecting layer and a film conducting layer on a surface of the substrate in sequence;

Etching an epitaxial structure from a middle portion to expose the N-type AlGaN layer in the epitaxial structure and then form a first groove with a slope;

Etching the outermost surface of the epitaxial structure on a side away from the slope or etching a first N-type AlGaN layer exposed out of the first groove on a side away from the slope to form a second groove, wherein the second groove penetrates the entire epitaxial structure, causing that the substrate is exposed, and the epitaxial structure is divided into a first epitaxial structure and a second epitaxial structure;

Filling the first groove with dielectric material to form a conductive groove contacting layer, wherein the groove contacting layer is connected electrically to the first N-type AlGaN layer in the first epitaxial structure, while is insulated from other structures in the first epitaxial structure;

Filling the second groove with insulating material to form the insulating layer for insulating the first epitaxial structure from the second epitaxial structure;

Providing a base plate;

Forming a wiring layer on a surface of the base plate;

Forming a P electrode, an N electrode, and an intermediate electrode on a surface of the wiring layer; and Assembling the base plate and the substrate to connect electrically the P electrode to the second P-type conducting layer in the first epitaxial structure, connect electrically the N electrode to the first N-type AlGaN layer in the second epitaxial structure, and connecte electrically the intermediate electrode to the groove contacting layer and the second P-type conducting layer in the second epitaxial structure.

Optionally, the preparing the AlN nucleation layer, the superlattice layer, the N-type AlGaN layer, the quantum well layer, the electron blocking layer, the first P-type conducting layer, the second P-type conducting layer, the metal reflecting layer and the film conducting layer on the surface of the substrate in sequence, comprises: preparing the AlN nucleation layer, the superlattice layer, the first N-type AlGaN layer, the N-type electron energy regulating layer, the second N-type AlGaN layer, the current expansion layer, the quantum well layer, the electron blocking layer, the first P-type conducting layer, the second P-type conducting layer, the film conducting layer and the passivation layer on the surface of the substrate in sequence, wherein the first and the second N-type AlGaN layers form the N-type AlGaN layer together, and a doping concentration of epitaxial material in second N-type AlGaN layer is lower than that in the first N-type AlGaN layer.

In the embodiments above of this disclosure, an ultraviolet LED chip and manufacturing method thereof are provided. In the ultraviolet LED chip, the epitaxial structure can be isolated into two insulated structure, i.e. the first epitaxial structure and the second epitaxial structure by growing the epitaxial structure on the surface of the substrate, and arranging an insulating layer perpendicular to the surface of the substrate in the middle of the epitaxial structure. The N-type AlGaN layer is stretched out through the groove contacting layer. In the ultraviolet LED chip, through the cooperation among the N electrode, P electrode and intermediate electrode on the base plate along with the first epitaxial structure and the second epitaxial structure, an LED and an ESD are formed respectively. The groove contacting layer serves as the N electrode of LED and meanwhile, connects electrically the N electrode of the LED to the P type region of the ESD, making the ESD connected to the ends of LED in anti-parallel for providing an electrostatic discharging channel, so as to reduce the direct damage of the ultraviolet LED chip caused by electrostatic discharging, increase a forward voltage of the LED and the antistatic intensity and improve the yield and reliability of the ultraviolet LED chip.

Moreover, during operation of the LED, the quantum well layer is a mainly portion to generate heat which can be directly conducted to the base plate through the adjacent groove contacting layer, thereby the heat dissipation performance of the ultraviolet LED chip is optimized.

Further, the slope of the groove contacting layer is disposed away from the insulating layer, and the light emitted by the LED is reflected by the inclined surface and scattered by the Fresnel scattering, thereby the light extraction coefficient of the ultraviolet LED chip is improved.

DESCRIPTION OF THE DRAWINGS

In order to make the technical solutions in embodiments of the present disclosure or in the prior art described more clearly, the drawings associated to the descriptions of the embodiments or the prior art will be illustrated concisely hereinafter. Apparently, the drawings described below are only some embodiments according to the present disclosure. Numerous drawings therein will be apparent to one of ordinary skill in the art based on the drawings described in the disclosure without creative efforts.

DETAILED DESCRIPTION OF PREFERRED EMBODIMENTS

The present disclosure will now be described more clearly and fully with reference to the accompanying drawings, in which exemplary embodiments of the disclosure are shown.

This disclosure may, however, be embodied in many different forms and should not be construed as limited to the embodiments set forth herein. It is appreciated that more embodiments will be obtained by one of ordinary skill in the art based on the embodiments described herein without paying any creative work.

Figure 2:
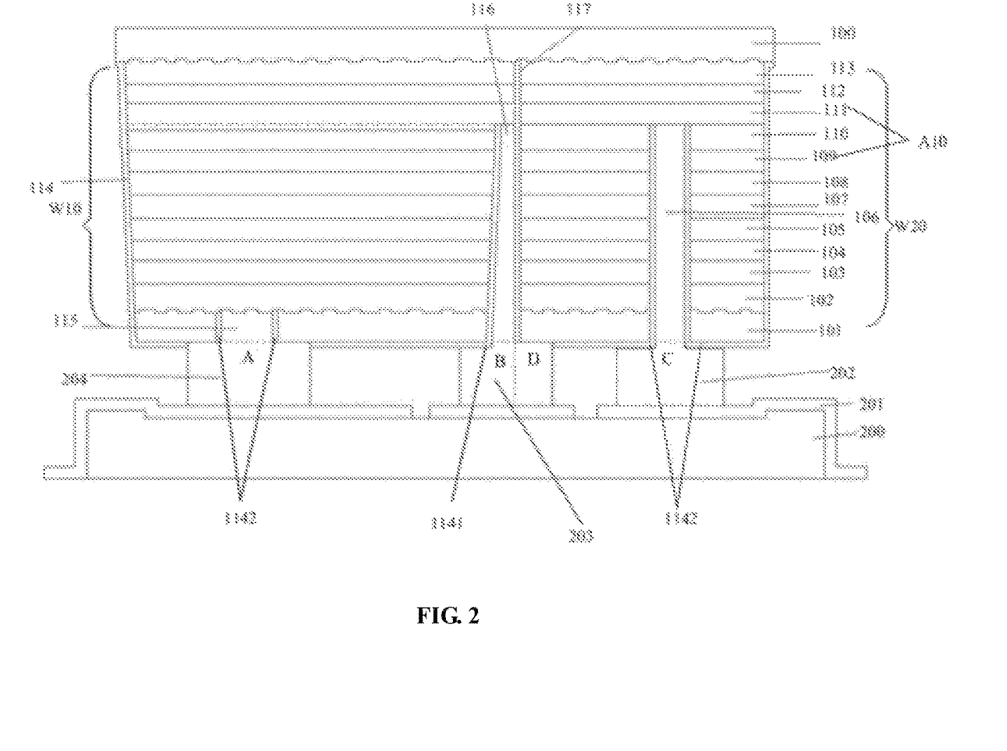
FIG. 2 is a sectional structural view of an ultraviolet LED chip according to an embodiment of this disclosure.

Referring to FIG. 2, an ultraviolet LED chip according to the disclosure comprises: a substrate 100; an epitaxial structure W10 growing on a surface of the substrate 100; an insulating layer 117 arranged in the epitaxial structure; a groove contacting layer 116 arranged in the epitaxial structure; and a base plate 200 located on a side of the epitaxial structure away from the substrate 100. A wiring layer 201, a P electrode 204, an N electrode 202, and an intermediate electrode 203 are arranged on a surface of the base plate 200 facing the substrate 100.

The epitaxial structure comprises: an AlN nucleation layer 113, a superlattice layer 112, an N-type AlGaN layer A10, a quantum well layer 107, an electron blocking layer 105, a first P-type conducting layer 104, a second P-type conducting layer 103, a metal reflecting layer 102 and a film conducting layer 101 growing on the surface of the substrate 100 in sequence.

The insulating layer 117 is located in a middle of the epitaxial structure for isolating the epitaxial structure, and separating the epitaxial structure into a first epitaxial structure W10 and a second epitaxial structure W20.

The groove contacting layer 116 penetrates a portion of the first epitaxial structure W10, is connected electrically to a first N-type AlGaN layer A10 in the first epitaxial structure W10, and is insulated from other structures in the first epitaxial structure W10. A slope is defined on a side of the groove contacting layer 116 away from the insulating layer 117.

The P electrode 204 is connected electrically to the metal reflecting layer 102 in the first epitaxial structure W10, the N electrode 202 is connected electrically to the first N-type AlGaN layer A10 in the second epitaxial structure W20, and the intermediate electrode 203 is connected electrically to the groove contacting layer 116 and the second P-type conducting layer 103 in the second epitaxial structure W20, respectively.

It should be noted that, in the ultraviolet LED chip, the first P-type conducting layer 104 is typically an AlGaN layer or an AlGaN transition layer, and the second P-type conducting layer 103 is typically a GaN layer.

Figure 3:
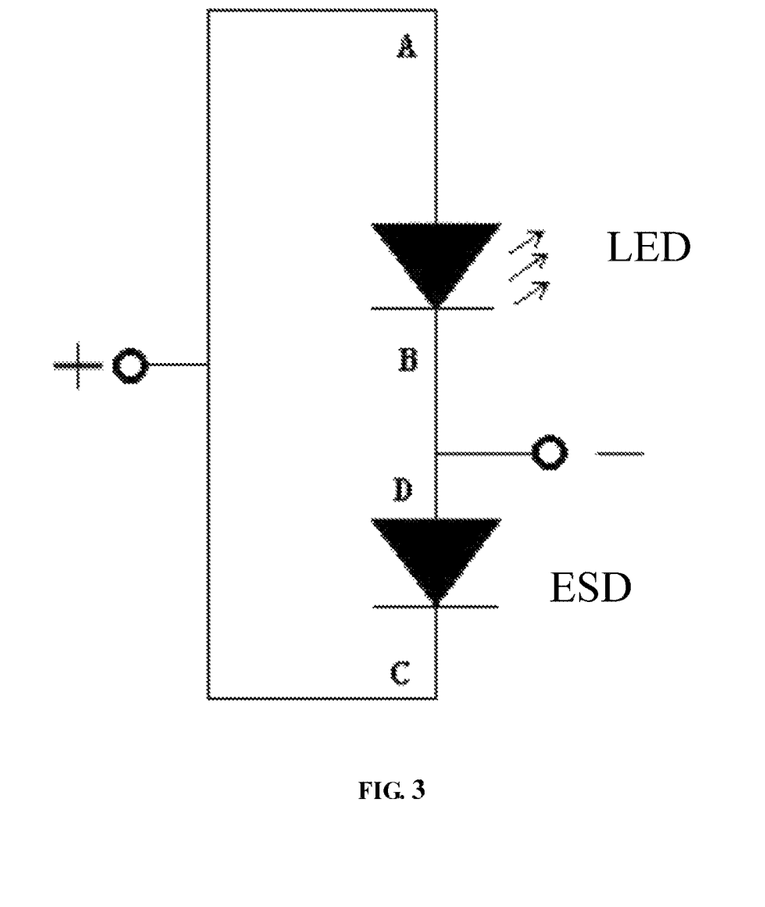
FIG. 3 is an equivalent circuit diagram of the ultraviolet LED chip according to an embodiment of this disclosure.

In the ultraviolet LED chip, the first epitaxial structure W10 is insulated from the second epitaxial structure W20 by arranging the insulating layer 117 on the surface of the substrate 100. The first N-type AlGaN layer A10 in the first epitaxial structure W10 is stretched out through the groove contacting layer 116. In the ultraviolet LED chip, through the cooperation among the N electrode 202, P electrode 204 and intermediate electrode 203 on the base plate 200 along with the first epitaxial structure W10 and the second epitaxial structure W20, an light emitting diode (LED) and an electro-static discharge (ESD) are formed respectively. Referring to FIG. 3, FIG. 3 is an equivalent circuit diagram of the LED and ESD in the ultraviolet LED chip. In FIG. 3, reference numerals A, B, C, and D correspond to A, B, C, and D in FIG. 2, that is, the P electrode 204 serves as the forward electrode A of the LED in FIG. 3, the N electrode 202 serves as the reverse electrode C of the ESD in FIG. 3, and the intermediate electrode 203 serves as both the reverse electrode B of the LED and the forward electrode D of the ESD in FIG. 3. The groove contacting layer 116 serves as the N electrode of the LED, and meanwhile, connects directly and electrically the N electrode of LED to the P-type region of the ESD, making the ESD enable to provide a electrostatic discharging channel for the ultraviolet LED chip, so as to reduce the direct damage of the ultraviolet LED chip caused by electrostatic discharging, increase a forward voltage of the LED and the antistatic intensity and improve the yield and reliability of the ultraviolet LED chip.

Moreover, during operation of the LED, the quantum well layer 107 is a mainly portion to generate heat, which can be directly conducted to the base plate 200 through the adjacent groove contacting layer 116, thereby the heat dissipation performance of the ultraviolet LED chip is optimized.

Further, the slope of the groove contacting layer 116 is disposed away from the insulating layer 117, and the light emitted by the LED is reflected by the inclined surface and scattered by the Fresnel scattering, thereby the light extraction coefficient of the ultraviolet LED chip is improved.

It should be further noted that, the grooves for receiving the insulating layer 117 and the groove contacting layer 116 can be formed by ICP etching, dry etching or wet etching, and then the grooves are filled with insulating materials and conductive materials to form the insulating layer 117 and the groove contacting layer 116 respectively.

Specifically, in one embodiment of this disclosure, reverse etching is performed on a surface of the epitaxial structure away from the substrate 100 to different degrees when forming the insulating layer 117 and the groove contacting layer 116. By performing etching or hollow treatment on the middle portion of the epitaxial structure with a mask, the first groove is formed which is relatively shallow and wide and of which section shape is a right-angled trapezoidal. The etching range of the first groove covers the surface of the epitaxial structure from the bottom up until a portion of the first N-type AlGaN layer A10 is exposed. Then, etching is performed along the vertical right-angled side of the right-angled trapezoid of the first groove to form the second groove which is relatively deeper and narrower and divides the epitaxial structure of the ultraviolet LED chip from the middle into two parts, i.e., the first epitaxial structure W10 and the second epitaxial structure W20. The first epitaxial structure W10 along with the substrate 100 and structures above the substrate form the LED, and the second epitaxial structure W20 along with the substrate 100 and structures above the substrate form the ESD. The etching range of the second groove, in which the insulating layer 117 is formed by filling insulating materials, covers the AlGaN layer from the bottom up until the sapphire substrate 100 at the top is exposed. Then, conductive materials and insulating materials are filled into the first and second grooves to form the groove contacting layer 116 and the insulating layer 117 respectively. Then, by providing an electrode contacting layer structure outside, the P electrode of the LED is connected electrically to the N electrode of the ESD, leading to an anti-parallel connection of the LED and the ESD structure. The equivalent circuit diagram is referred to FIG. 3. As a result, the direct shock to the LED caused by the large current pulse or the surge voltage in the circuit is avoided effectively, and the hazards to the ultraviolet LED chips which come from electrostatic discharging are reduced.

The sectional shape of the groove contacting layer 116 may also be a triangle, and is preferably a right-angled trapezoid for its better reflection effect and being more suitable to improve the light efficiency of the ultraviolet LED chips.

In one embodiment of this disclosure, after formation of the quantum well layer 107, the growth environment temperature is increased rapidly and maintained to 1040° C. Epitaxy of the electron blocking layer 105 and the first P-type conducting layer 104 doped with Mg is formed on the surface of the quantum well layer 107. Then the growth environment temperature is lowered slowly. Epitaxy of the second P-type conducting layer 103 is formed on the surface of the first P-type conducting layer 104, and the silicon dioxide layer with lattice structure on the surface is removed by dry etching or wet etching process. The metal reflecting layer, of which the thickness is preferably 50 nm±5 nm, is deposited on the step surface of the P-type GaN at the bottom of the LED epitaxial layer structure. Special process, such as surface roughening is performed on the metal reflecting layer. At the same time; the metal reflecting layer adopts aluminum or titanium aluminum alloy as material, so that the incident light to the bottom can be reflected back maximally to the front surface by aluminum and shot out, which improves the output light efficiency and enhance the output power of the ultraviolet LED chips greatly.

Then, the film conducting layer is arranged on the surface of the metal reflecting layer, and the growth process of the LED epitaxial layer is substantially complete. Specifically, a transparent film conducting layer, of which the thickness is 50 nm±5 nm, is uniformly deposited by using a magnetron sputtering apparatus in combination with a process such as evaporation or electroplating, and the material for the film conducting layer adopts GaZnO with excellent conductivity, or ITO, FTO etc. Due to the high density characteristics, the film conducting layer shows high reflectivity, which makes the light emitted from the ultraviolet LED chip more uniform, and makes the output light efficiency and the output power higher. Then, an inclined side wall structure is formed by etching the vertical side wall at one end of the LED epitaxial structure using a photolithography and etching technique. The reflection of the inclined side wall structure and the scattering of Fresnel improve the light efficiency of the LED chip. Then the P electrode 204 and the electrode contacting layer structure is arranged on the film conducting layer, and the structure, which is located in electrode region of the LED epitaxial layer structure, composing of the film conducting layer, preferably serves as a medium to interconnect the external electrode contacting structure and the internal epitaxial layer structure, thereby functioning as an intermediate bridge contacting.

Referring to FIG. 2, based on the above embodiment, the N-type AlGaN layer A10 in an embodiment of this disclosure comprises: a first N-type AlGaN layer 111 and a second N-type AlGaN layer 109.

The second N-type AlGaN layer 109 is located on a side of the first N-type AlGaN layer 111 away from the superlattice layer 112.

The doping concentration of the epitaxial material in second N-type AlGaN layer 109 is lower than that in the first N-type AlGaN layer 111.

In the embodiment, the N-type AlGaN layer A10 is optimized. The first N-type AlGaN layer 111 and the second N-type AlGaN layer 109 with different doping concentrations are sequentially disposed. Preferably, the total thickness of the first N-type AlGaN layer 111 and the second N-type AlGaN layer 109 is ensured to be equal to the thickness of mainstream AlGaN layer in the prior art. Thus, thinning treatment is performed to the second N-type AlGaN layer 109 to make it much thinner than the first N-type AlGaN layer 111.

Specifically, in one embodiment of the disclosure, the thickness of the N-type AlGaN layer A10 composed of the first N-type AlGaN layer 111 and the thinned second N-type AlGaN layer 109 maintains at about 2 μm±0.2 μm. On the one hand, by increasing rapidly and maintaining the temperature in reaction device to 1040° C., the first N-type AlGaN layer 111, whose thickness is 1.8 μm±0.18 μm, and the second N-type AlGaN layer 109, whose thickness is 0.1 μm±0.01 μm, are formed on the surface of the superlattice structure. On the other hand, the carrier concentration in the first N-type AlGaN layer 111 is ensured to be $3\times10^{18}$ cm$^{-3}$, and the carrier concentration in the second N-type AlGaN layer 109 is maintained about $5\times10^{17}$ cm$^{-3}$ at the same time by synchronous controlling. In particular, in consideration of the light reflection and absorption of material in the chip, combined with thinning treatment technique to the epitaxial structure, thinning treatment is applied in the second N-type AlGaN layer 109 to increase the equivalent series resistance in the vertical direction of the LED epitaxial structure, and make the current extension of the LED epitaxial structure in the horizontal direction more efficient, so as to improve the output intensity of the ultraviolet LED chip, reduce the damage to the ultraviolet LED chip caused by electrostatic discharging, surge voltage and high current pulse, and improve the reliability of the ultraviolet LED chip at the same time.

Based on the above embodiment, referring to FIG. 2, the epitaxial structure in another embodiment comprises: an N-type electron energy regulating layer 110 located between the first N-type AlGaN layer 111 and the second N-type AlGaN layer 109.

The dielectric constant of the N-type electron energy regulating layer 110 is smaller than those of the first N-type AlGaN layer 111 and the second N-type AlGaN layer 109, and the doping concentration of the epitaxial material in the N-type electron energy regulating layer 110 is greater than those in the first and the second N-type AlGaN layers.

Specifically, in one embodiment of this disclosure, the temperature inside the reaction device is constant at about 1040° C. when preparing the N-type electron energy regulating layer 110. Between the first N-type AlGaN layer 111 and the second N-type AlGaN layer 109, the N-type electron energy regulating layer 110 adopting δ doping method is further provided, of which the thickness is preferably 0.1 μm±0.01 μm. Specifically, the N-type electron energy regulating layer 110 adopts N-type AlGaN epitaxial material with 40%-50% aluminum composition, whose dielectric constant is smaller than those of the first N-type AlGaN layer 111 and the second N-type AlGaN layer 109. The doping concentration of the epitaxial material in the N-type electron energy regulating layer 110 is greater than those in the first and the second N-type AlGaN layers.

Due to the presence of the δ-doping type N-type electron energy regulating layer 110, the formation of leakage current is reduced, the electron energy in the epitaxial structure N-type region is adjusted directly, and the hole injection efficiency is improved at the same time.

Based on the above embodiment, the ultraviolet LED chip in another embodiment further comprises: a passivation layer 114 covering the side walls and bare terraces of the first epitaxial structure W10 and the second epitaxial structure W20.

The passivation layer 114 includes a first connection portion 1141, and the first connection portion 1141 is located between the intermediate electrode 203 and the first epitaxial structure W10 and on a side of the groove contacting layer 116 away from the insulating layer 117, so as to make the groove contacting layer 116 electrically connected to the first N-type AlGaN layer 111 in the first epitaxial structure W10 and make the groove contacting layer 116 insulated from other structures in the first epitaxial structure W10.

It should be noted that the functions of the passivation layer 114 include not only avoiding corrosion, oxidation, and destruction of the epitaxial structure of the ultraviolet LED chip, but also though the first connecting portion 1141, electrically connecting the groove contacting layer 116 to the N-type AlGaN layer A10 through the N-type electron energy regulating layer 110 in the first epitaxial structure W10, while insulating from other structures in the first epitaxial structure W10.

Based on the above embodiment, referring to FIG. 2, the epitaxial structure in another embodiment further comprises: a current expansion layer 108 located between the second N-type AlGaN layer 109 and the quantum well layer 107.

Specifically, in an embodiment of the application, during the process of preparing the epitaxial structure of the ultraviolet LED chip, a silicon dioxide layer with lattice structure is formed on a mask by depositing the mask structure on the second N-type AlGaN layer 109, combined with process such as deposition and etching, and then the epitaxial structure of the ultraviolet LED chip is cleaned and dried. Then the current expansion layer, of which the thickness is preferably 100 nm±10 nm, is deposited on the second N-type AlGaN layer 109 by adopting a magnetron sputtering device. Treatments such as etching, roughening, and the like are further applied to the current expansion layer to form a graphic current expansion structure. Then, the temperature in the reaction apparatus is gradually lowered to 750° C., and further, five cycles of the AlGaN/AlGaN quantum well layer 107 are epitaxially formed on the surface of the second N-type AlGaN layer 109. Specifically, the quantum well layer 107 of each cycle contains an AlGaN well layer with the thickness of 10 nm±1 nm and an AlGaN barrier layer with the thickness of 2 nm±0.2 nm. By means of providing the current expansion layer between the quantum well layer 107 and the second N-type AlGaN layer 109 in the epitaxial structure of the ultraviolet LED chip, most of the current will not be blocked in the region after passing through the quantum well layer 107 during flowing laterally the N-type AlGaN layer A10, thereby the current expansion becomes more efficient, the injection efficiency is higher, and the generation of Joule heat is reduced.

Based on the above embodiment, referring to FIG. 2, the ultraviolet LED chip in another embodiment further comprises: a first electrode contacting layer 115 and a second electrode contacting layer 106.

The passivation layer 114 comprises a second connecting portion 1141.

The first electrode contacting layer penetrates the film conducting layer 101 in the first epitaxial structure W10, and the P electrode 204 is electrically connected to the metal reflecting layer 102 in the first epitaxial structure W10 through the first electrode contacting layer 115.

The second electrode contacting layer penetrates the second epitaxial structure W20 partly, and the N electrode 202 is electrically connected to the first N-type AlGaN layer 111 in the second epitaxial structure W20 through the second electrode contacting layer 106.

The second connection portion 1142 annularly covers the side wall of the second electrode contacting layer to insulate the second electrode contacting layer from other structures in the second epitaxial structure.

Specifically, after the formation of the film conducting layer, the N electrode 202 region and the P electrode 204 region are further processed with the reverse etching to form a third groove structure with different depths. The third groove structure is preferably cylindroid with the cross section of a regular hexagon. The etching range of the third groove structure in the N electrode 202 covers the bottom of the film conducting layer from the bottom up until a portion of the first N-type AlGaN layer 111 is exposed, while the etching range of the third groove structure in P electrode 204 penetrates the film conducting layer. A plurality of internal electrode groove structures or groove structure matrices are provided and the etching rate is controlled strictly during the etching process, so as to ensure that only a small portion of the step surface is etched, reduce the damage that etching caused to the illuminating region of epitaxial layer and improve the light output intensity of the ultraviolet LED chip. Then a metal or alloy material is deposited into the third groove structure to form the first electrode contacting layer and the second electrode contacting layer respectively. Specifically, by selecting a Ti/Al alloy as the electrode contacting material, the aluminum on the bottom of the electrode surface enhances the light reflection, reduces the absorption of the light by the edge of the electrode and increases the extraction of the side light of the sapphire substrate 100. With the electrode groove structure and the internal contacting layer structure described above according to this disclosure, when high external voltage is applied to the ultraviolet LED chip, a large current pulse formed flows through the epitaxial layer of the ultraviolet LED chip, and flows through the internal contacting layer structure quickly, which plays a better shunting roles and avoids the directly influence caused by the large current pulse to the LED epitaxial layer.

In summary, the epitaxial structure of the ultraviolet LED chip undergoes multiple annealing processes at different temperatures before and after growth, thereby enhancing the bonding strength between the material structures, reducing the internal contacting resistance and improving the antistatic intensity of the ultraviolet LED chip. By means of providing external electrodes (the P electrode 204, the N electrode 202 and the intermediate electrode 203) respectively at the interfaces between the step surfaces, the internal contacting layer, and the film conducting layer structure, the other end of these external electrodes are connected to the metal wiring layer 201 directly. During the deposition and evaporation process of the external electrode structure, the output light efficiency of the LED chip is further improved by designing a novel reflecting electrode made of Ti/Al alloy and optimizing the Ohmic contacting mode and bonding strength. By optimizing the films on the surfaces of the P electrode 204 and the N electrode 202 through a graphic processing technique, and then combining the preparation technology for the transparent conducting electrode and optimizing the material type of the contacting surface of the electrode, the effective area of the electrode is increased, the contacting resistance is reduced, which leads to a more uniform current distribution and faster current expansion.

In addition, the step surfaces in the epitaxial structure of the ultraviolet LED chip, the side walls of the epitaxial layer structure and the surface of the external electrode provided in the embodiment of this disclosure, are all provided with a passivation layer 114 for insulation treatment, which prevents the chip from corrosion of the external environment, reduces the influence of leakage current occurring in the step surfaces and step side walls on the chip, solves the current expansion problem of the active region in the epitaxial structure of the ultraviolet LED chip, reduces the current accumulation effect and improves the optical output power of the ultraviolet LED chip. Similarly, the surface of the contacting layer undergoes annular passivation treatment to form a annular cylindrical isolation layer structure covering the inner contacting layer, so as to avoid the formation of leakage current on the side wall of the ultraviolet LED chip or the step surface, prevent the short circuit caused directly by the creepage between the side wall of the metal electrode contacting layer structure and the internal contacting layer of the chip. The thickness of the isolation layer is optimally set to 10 nm±1 nm.

In the embodiment of this disclosure, the wafer surface bonding technology is applied to post-procedures of the ultraviolet LED chip such as diebonding, flip chip bonding and packaging. The ultraviolet LED chip is weld to the base plate 200 provided with the metal wiring layer 201 by means of flip chip bonding through the electrode contacting layer structure in the middle portion, and then the preliminary packaging process of the LED chip is completed.

On the one hand, in combination with the design of the wiring layer 201 and the creation of the base plate 200 process, a radiator structure composed of a high-density wiring layer 201 and a base made of an AlN ceramic material is provided in a heat sink structure of the base plate 200. Since the quantum well layer 107 is a mainly portion to generate heat, the heat diffusion path between the heat source and the heat sink structure of the base plate 200 is significantly shortened, and the heat dissipation of the LED chip is accelerated, thereby preventing the chip from failing due to overheating. On the other hand, the material filled in the structure of a plurality of electrode contacting layers provided in the LED epitaxial layer structure in this disclosure is metals or metal alloys with good thermal conductivity, as a result the heat inside the ultraviolet LED chip can be transmitted to the outside in time. The wiring layer 201 is expanded maximally to the outside on the surface of the base plate 200, and it is ensured that two separate portions are formed after separating the middle portion of the wiring layer 201, which forms a insulated, isolated track with a certain width between the P electrode 204 region and the N electrode 202 region to prevent the occurrence of short circuits in the ultraviolet LED chip.

The manufacturing method of the ultraviolet LED chip according to the embodiment of this disclosure will be described below, which can be referred to each other with the structure and preparation process of the ultraviolet LED chip described above.

Figure 4:
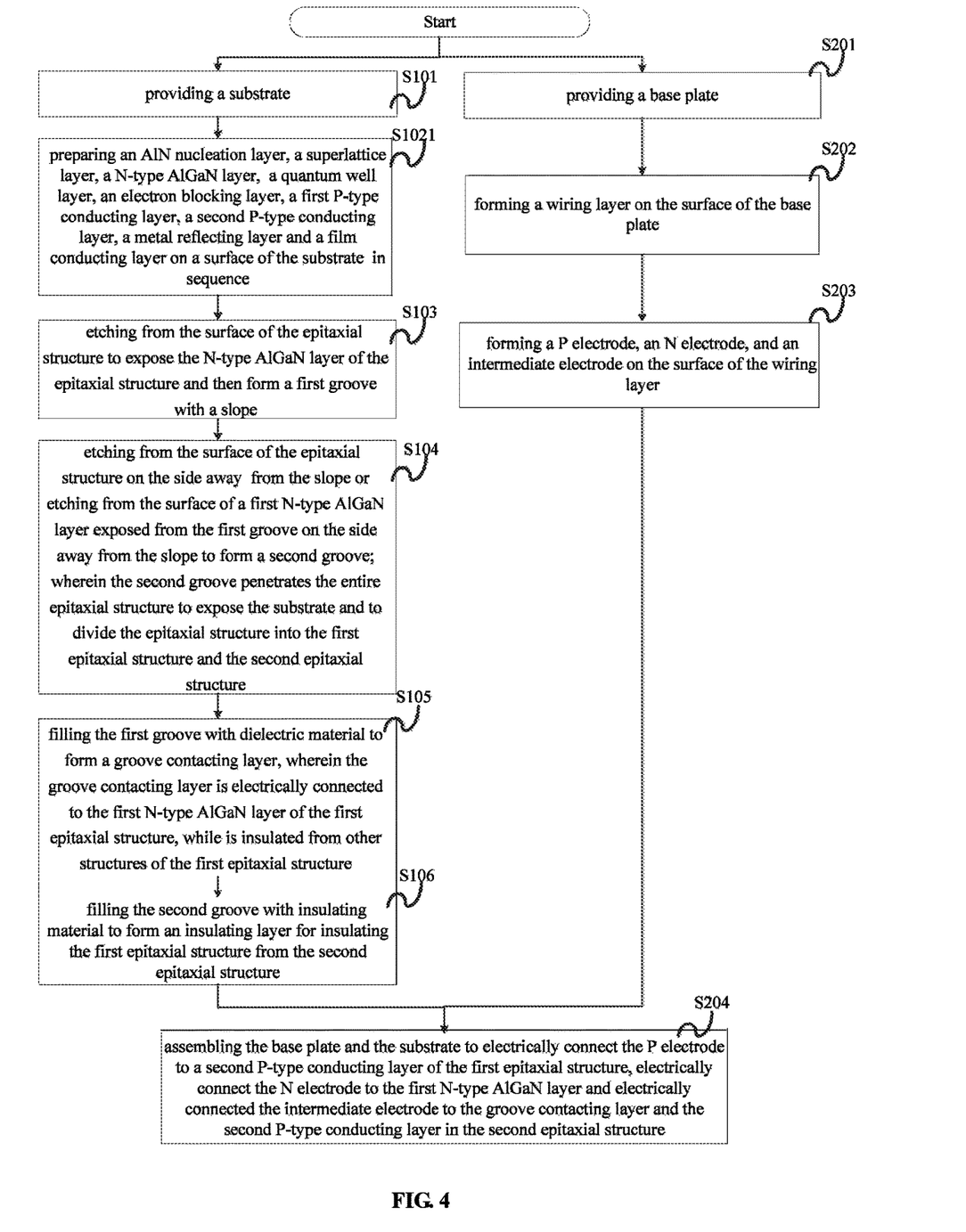
FIG. 4 is a flow chart of a manufacturing method of the ultraviolet LED chip according to an embodiment of this disclosure.

The disclosure provides a manufacturing method of the ultraviolet LED chip, referring to FIG. 4, comprising:

S101: providing the substrate;

S102: preparing the AlN nucleation layer, the superlattice layer, the N-type AlGaN layer, the quantum well layer, the electron blocking layer, the first P-type conducting layer, the second P-type conducting layer, the metal reflecting layer and the film conducting layer on a surface of the substrate in sequence;

S103: etching from the surface of the epitaxial structure to expose the N-type AlGaN layer in the epitaxial structure and then form a first groove with a slope;

S104: etching from the surface of the epitaxial structure on the side away from the slope or etching from the surface of the first N-type AlGaN layer exposed from the first groove on the side away from the slope to form the second groove, wherein the second groove penetrates the entire epitaxial structure to expose the substrate and to divide the epitaxial structure into the first epitaxial structure and the second epitaxial structure;

The groove contacting layer and the insulating layer may be in close contact directly with each other, or may be optimized to fill partially only between the groove contacting layer and the insulating layer, and a certain gap is reserved between them.

Figure 5:
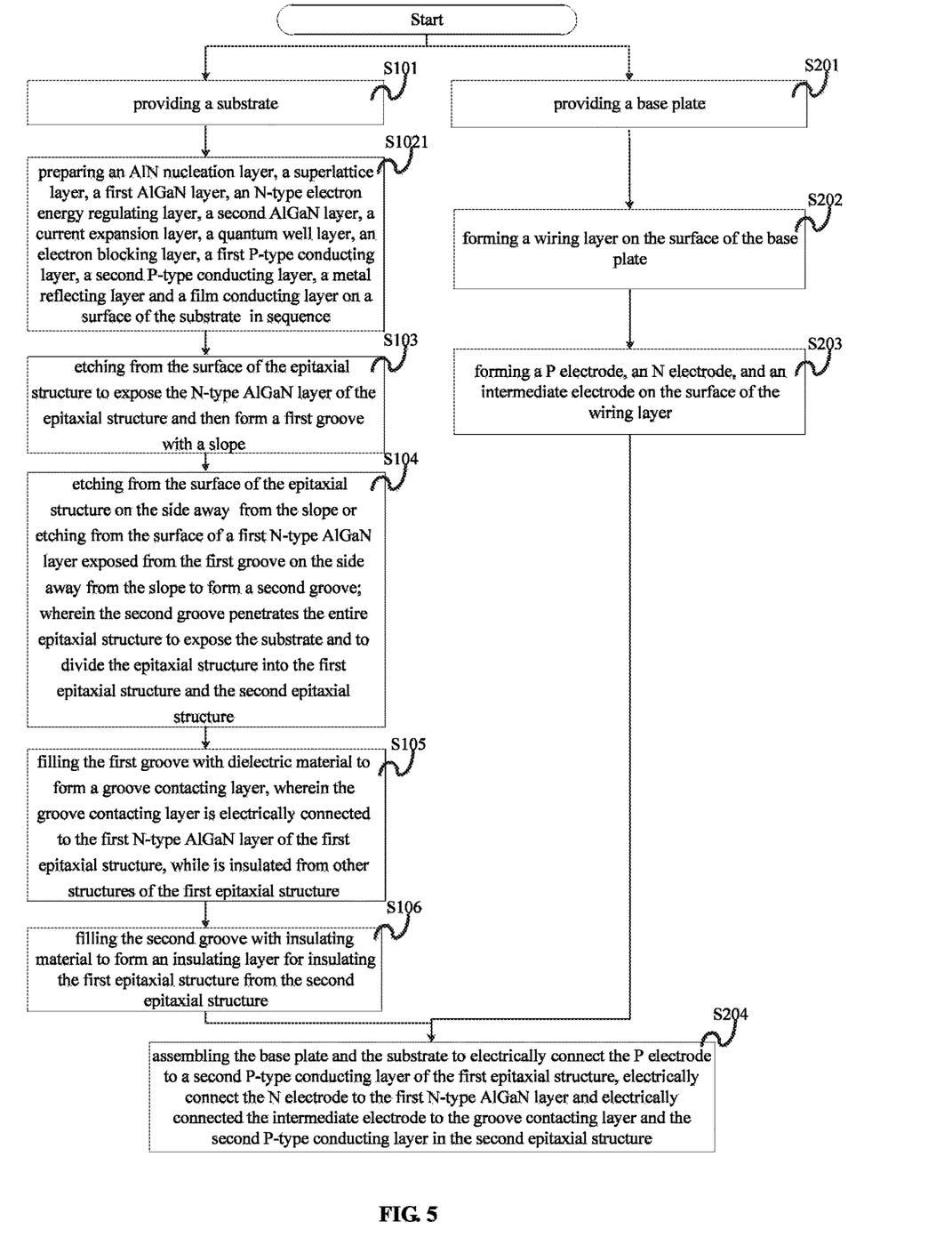
FIG. 5 is a flow chart of a manufacturing method of the ultraviolet LED chip according to another embodiment of this disclosure.

S105: filling the first groove with dielectric material to form a groove contacting layer, wherein the groove contacting layer is electrically connected to the first N-type AlGaN layer in the first epitaxial structure, while is insulated from other structures in the first epitaxial structure;

S106: filling the second groove with insulating material to form an insulating layer for insulating the first epitaxial structure from the second epitaxial structure;

S201: providing a base plate;

S202: forming a wiring layer on the surface of the base plate;

S203: forming a P electrode, an N electrode, and an intermediate electrode on the surface of the wiring layer;

S204: assembling the base plate and the substrate to electrically connect the P electrode to a second P-type conducting layer in the first epitaxial structure, electrically connect the N electrode to the first N-type AlGaN layer in the second epitaxial structure and electrically connected the intermediate electrode to the groove contacting layer and the second P-type conducting layer in the second epitaxial structure;

Based on the above embodiment, referring to FIG. 5, in another embodiment of this disclosure, the step of preparing the AlN nucleation layer, the superlattice layer, the N-type AlGaN layer, the quantum well layer, the electron blocking layer, the first P-type conducting layer, the second P-type conducting layer, the metal reflecting layer and the film conducting layer on the surface of the substrate in sequence comprises:

S1021: preparing the AlN nucleation layer, the superlattice layer, the first N-type AlGaN layer, the N-type electron energy regulating layer, the second N-type AlGaN layer, the current expansion layer, the quantum well layer, the electron blocking layer, the first P-type conducting layer, the second P-type conducting layer, the metal reflecting layer and the film conducting layer on the surface of the substrate in sequence.

The first and the second N-type AlGaN layer form the N-type AlGaN layer, and the doping concentration of N-type material in second N-type AlGaN layer is lower than that in the first N-type AlGaN layer.

Specifically, in an embodiment of the present disclosure, the manufacturing method of the ultraviolet LED chip comprises the following processes.

At first, the sapphire substrate undergoes some pretreatment such as baking and cleaning in high temperature environment to remove contaminants on the surface of the substrate. Before the growth of the epitaxial structure of the nitride ultraviolet LED chip by adopting the MOCVD reaction device, the AlN material is grown on the c-plane of the sapphire substrate. Adopting a magnetron sputtering device under the low temperature experimental conditions, the AlN nucleation layer structure is formed on the sapphire substrate. A 20-cycle AlN/AlGaN superlattice structure is epitaxially grown on the surface of the AlN nucleation layer by adopting the MOCVD reaction apparatus. Each cycle of the AlN/AlGaN superlattice structure includes an AlN layer with a thickness of 20 nm and an AlGaN layer with a thickness of 20 nm.

In the process of preparing the epitaxial structure of the ultraviolet LED chip, the N-type GaN layer in conventional ultraviolet LED chip is optimized. At the same time, combined with the existing epitaxial process level, the thickness of the N-type AlGaN layer composed of the first N-type AlGaN layer and the thinned second N-type AlGaN layer is ensured to be about 2 μm±0.2 μm. On the one hand, by increasing rapidly and maintaining the temperature in reaction device to 1040° C., the first N-type AlGaN layer, whose thickness is 1.8 μm±0.18 μm, and the second N-type AlGaN layer, whose thickness is 0.1 μm±0.01 μm, are formed on the surface of the superlattice structure. On the other hand, the carrier concentration in the first N-type AlGaN layer 111 is ensured to be $3\times10^{18}$ cm$^{-3}$, and the carrier concentration in the second N-type AlGaN layer 109 is maintained about $5\times10^{17}$ cm$^{-3}$ at the same time by synchronous controlling. In particular, in consideration of the light reflection and absorption of material in the chip, combined with thinning treatment technique to the epitaxial structure, thinning treatment is applied in the second N-type AlGaN layer to increase the equivalent series resistance in the vertical direction of the LED epitaxial structure and make the current extension of the LED epitaxial structure in the horizontal direction more efficient, so as to improve the output intensity of the ultraviolet LED chip and reduce the damage to the ultraviolet LED chip caused by electrostatic discharging, surge voltage and high current pulse, and improve the reliability of the ultraviolet LED chip at the same time.

The temperature inside the reaction device is constant at about 1040° C. when preparing the N-type electron energy regulating layer. Between the first N-type AlGaN layer and the second N-type AlGaN layer, the N-type electron energy regulating layer adopting δ doping method is further provided, of which the thickness is preferably 0.1 μm±0.01 μm. Specifically, the N-type electron energy regulating layer adopts N-type AlGaN epitaxial material with 40%-50% aluminum composition, whose the dielectric constant is smaller than that of the first N-type AlGaN layer and the second N-type AlGaN layer. The doping concentration of the N-type material in the N-type electron energy regulating layer is greater than those in the first and the second N-type AlGaN layers.

Due to the presence of the δ-doping type N-type electron energy regulating layer, the formation of leakage current is reduced, the electron energy in the epitaxial structure N-type region is directly adjusted, and the hole injection efficiency is improved at the same time.

Then, a silicon dioxide layer with lattice structure is formed on a mask by depositing the mask structure on the second N-type AlGaN layer, combined with process such as deposition and etching, and the epitaxial structure of the ultraviolet LED chip is cleaned and dried. The current expansion layer, of which the thickness is preferably 100 nm±10 nm, is deposited on the second N-type AlGaN layer by adopting a magnetron sputtering device. Treatments such as etching, roughening, and the like are further applied to the current expansion layer to form a graphic current expansion structure. Then, the temperature in the reaction apparatus was gradually lowered to 750° C., and five cycles of AlGaN/AlGaN quantum well layer is epitaxially formed on the surface of the second N-type AlGaN layer. Specifically, the quantum well layer of each cycle contains an AlGaN well layer with the thickness of 10 nm±1 nm and an AlGaN barrier layer with the thickness of 2 nm±0.2 nm. By means of providing the current expansion layer between the quantum well layer in the epitaxial structure of the ultraviolet LED chip and the second N-type AlGaN layer, most of the current will not be blocked in the region after passing through the quantum well layer during flowing laterally the N-type AlGaN layer, thereby the current expansion becomes more efficient, the injection efficiency is higher, and the generation of Joule heat is reduced.

After formation of the quantum well layer, the growth environment temperature is increased rapidly and maintained to 1040° C. Epitaxy of the electron blocking layer and the first P-type conducting layer doped with Mg is formed on the surface of the quantum well layer. Then lower the growth temperature is lowered slowly. Epitaxy of the second P-type conducting layer is formed on the surface of the first P-type conducting layer, and the silicon dioxide layer with lattice structure on the surface is removed by dry etching or wet etching process. The metal reflecting layer, of which the thickness is-preferably 50 nm±5 nm, is deposited on the step surface of the P-type GaN at the bottom of the LED epitaxial layer structure. Special process, such as surface roughening is performed on the metal reflecting layer. At the same time, the metal reflecting layer adopts aluminum or titanium aluminum alloy as material, so that the incident light to the bottom can reflected back maximally to the front surface by aluminum and shot out, which improves the output light efficiency and enhance the output power of the ultraviolet LED chips greatly.

Then, the film conducting layer is arranged on the surface of the metal reflecting layer, and the growth process of the LED epitaxial layer is substantially complete. Specifically, a transparent film conducting layer, of which the thickness is 50 nm±5 nm, is uniformly deposited by using a magnetron sputtering apparatus in combination with a process such as evaporation or electroplating, and the material for the film conducting layer adopts GaZnO with excellent conductivity, or ITO, FTO etc. Due to the high density characteristics, the film conducting layer shows high reflectivity, which makes the light emitted from the ultraviolet LED chip more uniform, and makes the output light efficiency and the output power higher. Then, an inclined side wall structure is formed by etching the vertical sidewall at one end of the LED epitaxial structure using a photolithography and etching technique. The reflection of the inclined sidewall structure and the scattering of Fresnel improve the light efficiency of the LED chip. Then the P electrode and the electrode contacting layer structure is arranged on the film conducting layer, and the structure, which is located in electrode region of the LED epitaxial layer structure, composing of the film conducting layer, preferably serves as a medium to interconnect the external electrode contacting structure and the internal epitaxial layer structure, thereby functioning as an intermediate bridge contacting.

When forming the insulating layer and the groove contacting layer, reverse etching is performed on a surface of the epitaxial structure away from the substrate to different degrees. By performing etching or hollow treatment on the middle portion of the epitaxial structure with a mask, the first groove is formed which is relatively shallow and wide and of which section shape is a right-angled trapezoidal. The etching range of the first groove covers the surface of the epitaxial structure from the bottom up until a portion of the first N-type AlGaN layer is exposed. Then, etching is performed along the vertical right-angled side of the right-angled trapezoid of the first groove to form the second groove which is relatively deeper and narrower and divides the epitaxial structure of the ultraviolet LED chip from the middle into two parts, i.e., the first epitaxial structure and a second epitaxial structure. The first epitaxial structure along with the substrate and structures above the substrate form the LED, and the second epitaxial structure along with the substrate and structures above the substrate form the ESD. The etching range of the second groove, in which the insulating layer is formed by filling insulating materials, covers the AlGaN layer from the bottom up until the sapphire substrate at the top is exposed. Then, conductive materials and insulating materials are filled into the first and second grooves to form the groove contacting layer and the insulating layer respectively. Then, by providing an electrode contacting layer structure outside, the P electrode of the LED is connected electrically to the N electrode of the ESD, leading to an anti-parallel connection of the LED and the ESD structure. The equivalent circuit diagram is referred to FIG. 3. As a result, the direct shock to the LED caused by the large current pulse or the surge voltage in the circuit is avoided effectively, and the hazards to the ultraviolet LED chips which come from electrostatic discharging are reduced.

In summary, the embodiments of this disclosure provide an ultraviolet LED chip and manufacturing method thereof. In the ultraviolet LED chip, the epitaxial structure can be isolated into two insulated structure, i.e. the first epitaxial structure and the second epitaxial structure by growing the epitaxial structure on the surface of the substrate, and arranging an insulating layer perpendicular to the surface of the substrate in the middle of epitaxial structure. The N-type AlGaN layer is stretched out through the groove contacting layer. In the ultraviolet LED chip, through the cooperation among the N electrode, P electrode and intermediate electrode on the base plate along with the first epitaxial structure and the second epitaxial structure, the LED and the ESD are formed respectively. The groove contacting layer serves as the N electrode of LED and meanwhile, connects electrically the N electrode of the LED to the P type region of the ESD, making the ESD connected to the ends of LED in anti-parallel for providing an electrostatic discharging channel, so as to reduce the direct damage of the ultraviolet LED chip caused by electrostatic discharging, increase a forward voltage of the LED and the antistatic intensity and improve the yield and reliability of the ultraviolet LED chip.

Moreover, during operation of the LED, the quantum well layer is a mainly portion to generate heat which can be directly conducted to the base plate through the adjacent groove contacting layer, thereby the heat dissipation performance of the ultraviolet LED chip is optimized.

Further, the slope of the groove contacting layer is disposed away from the insulating layer, and the light emitted by the LED is reflected by the inclined surface and scattered by the Fresnel scattering, thereby the light extraction coefficient of the ultraviolet LED chip is improved.

The various embodiments in this disclosure are described in a progressive manner, each embodiment focuses on differences from other embodiments, and the same or similar parts between different embodiments can be referred to each other.

The above description of the disclosed embodiments enables one of ordinary skill in the art to realize or use the invention. It is obvious to one of ordinary skill in the art to make various modifications to these embodiments. The general principles defined herein may be implemented in other embodiments without departing from the spirit or scope of the invention, therefore the present invention is not intended to be limited to the embodiments illustrated herein, but fall in the widest scope in accord with the principle and novel characteristics.

We claim:

1. An ultraviolet LED chip, comprising:
a substrate;
an epitaxial structure growing on a surface of the substrate;
an insulating layer, for separating the epitaxial structure into a first epitaxial structure and a second epitaxial structure, sandwiched between the first epitaxial structure and the second epitaxial structure;
a groove contacting layer arranged in the first epitaxial structure; and
a base plate located on a side of the epitaxial structure away from the substrate;
wherein a wiring layer, a P electrode, an N electrode and an intermediate electrode are arranged on a surface of the base plate facing the substrate;
both the first epitaxial structure and the second epitaxial structure comprise: an AlN nucleation layer, a superlattice layer, an N-type AlGaN layer, a quantum well layer, an electron blocking layer, a first P-type conducting layer, a second P-type conducting layer, a metal reflecting layer and a film conducting layer growing on the surface of the substrate in sequence;
the groove contacting layer penetrates a portion of the first epitaxial structure, is connected electrically to the N-type AlGaN layer in the first epitaxial structure, and is insulated from other structures in the first epitaxial structure; and a slope is defined on a side of the groove contacting layer away from the insulating layer;
the P electrode is connected electrically to the film conducting layer in the first epitaxial structure, the N electrode is electrically connected to the N-type AlGaN layer in the second epitaxial structure and the film conducting layer, and the intermediate electrode is electrically connected to the groove contacting layer and the film conducting layer in the second epitaxial structure; and
the quantum well layer transfers heat to the base plate through the groove contacting layer.

2. The ultraviolet LED chip of claim 1, wherein the N-type AlGaN layer comprises a first N-type AlGaN layer and a second N-type AlGaN layer;
the second N-type AlGaN layer is located at a side of the first N-type AlGaN layer away from the superlattice layer;
a doping concentration of epitaxial material in the second N-type AlGaN layer is lower than that in the first N-type AlGaN layer; and
an epitaxial layer thickness of the second N-type AlGaN layer is lower than that of the first N-type AlGaN layer.

3. The ultraviolet LED chip of claim 2, wherein the epitaxial structure further comprises an N-type electron energy regulating layer located between the first and the second N-type AlGaN layers; a dielectric constant of the N-type electron energy regulating layer is smaller than those of the first and the second N-type AlGaN layers; and a doping concentration of epitaxial material in the N-type electron energy regulating layer is greater than those of the first and the second N-type AlGaN layers.

4. The ultraviolet LED chip of claim 3, further comprising a passivation layer covering side walls and bare terraces of the first and the second epitaxial structures; the passivation layer includes a first connection portion, and the first connection portion is located between the intermediate electrode and the first epitaxial structure and on a side of the groove contacting layer away from the insulating layer, so as to make the groove contacting layer electrically connected to the first N-type AlGaN layer in the first epitaxial structure and make the groove contacting layer insulated from other structures in the first epitaxial structure.

5. The ultraviolet LED chip of claim 2, wherein a thickness of the second N-type AlGaN layer is 0.1 µm±0.01 µm with endpoints included.

6. The ultraviolet LED chip of claim 3, wherein the epitaxial structure further comprises a current expansion layer located between the second N-type AlGaN layer and the quantum well layer.

7. The ultraviolet LED chip of claim 3, further comprising a first electrode contacting layer and a second electrode contacting layer;
- wherein the passivation layer further includes a second connection portion;
- the first electrode contacting layer penetrates the film conducting layer in the first epitaxial structure, and the P electrode is connected electrically to the metal reflecting layer in the first epitaxial structure through the first electrode contacting layer;
- the second electrode contacting layer penetrates the second epitaxial structure, and the N electrode is connected electrically to the first N-type AlGaN layer in the second epitaxial structure through the second electrode contacting layer; and
- the second connection portion annularly covers a side wall of the second electrode contacting layer to insulate the second electrode contacting layer from other structures in the second epitaxial structure.

\* \* \* \* \*